US011569821B2

(12) United States Patent
Braun et al.

(10) Patent No.: US 11,569,821 B2
(45) Date of Patent: Jan. 31, 2023

(54) SUPERCONDUCTING EXCLUSIVE-OR (XOR) GATE SYSTEM

(71) Applicants: Alexander Louis Braun, Baltimore, MD (US); Josh Lance Puckett, Raleigh, NC (US)

(72) Inventors: Alexander Louis Braun, Baltimore, MD (US); Josh Lance Puckett, Raleigh, NC (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/354,603

(22) Filed: Jun. 22, 2021

(65) Prior Publication Data

US 2022/0407522 A1 Dec. 22, 2022

(51) Int. Cl.
  *H03K 19/21* (2006.01)
  *H03K 3/38* (2006.01)
  *H03K 19/195* (2006.01)

(52) U.S. Cl.
  CPC ............... *H03K 19/21* (2013.01); *H03K 3/38* (2013.01); *H03K 19/195* (2013.01)

(58) Field of Classification Search
  CPC ......... H03K 19/21; H03K 19/195; H03K 3/38
  USPC ....................................................... 327/291
  See application file for complete search history.

(56) References Cited

U.S. PATENT DOCUMENTS

| | | | |
|---|---|---|---|
| 5,309,038 | A | 5/1994 | Harada et al. |
| 6,507,234 | B1 | 1/2003 | Johnson et al. |
| 6,549,059 | B1 | 4/2003 | Johnson |
| 6,580,310 | B2 | 6/2003 | Herr |
| 6,724,216 | B2 | 4/2004 | Suzuki et al. |

(Continued)

FOREIGN PATENT DOCUMENTS

| | | |
|---|---|---|
| CN | 110069238 A1 | 7/2019 |
| EP | 0467104 | 1/1992 |

(Continued)

OTHER PUBLICATIONS

Koch, et al.: "A NRZ—Output Amplifier for RSFQ Circuits", IEEE Transaction on Applied Superconductivity, vol. 9, No. 2, pp. 3549-3552, Jun. 1999.

(Continued)

*Primary Examiner* — Tomi Skibinski
(74) *Attorney, Agent, or Firm* — Tarolli, Sundheim, Covell & Tummino LLP (57) ABSTRACT

One example describes a superconducting XOR-gate system. The system includes a pulse generator configured to generate a decision pulse. The system also includes an input superconducting XOR-2 gate that receives a first superconducting logic input signal and a second superconducting logic input signal and is configured to perform a logic XOR function based on the decision pulse on a given phase of a clock signal to provide an intermediate superconducting logic output signal. The system also includes an output superconducting XOR-2 gate that receives the intermediate superconducting logic output signal and a third superconducting logic input signal and is configured to perform a logic XOR function based on the decision pulse on the given phase of the clock signal to provide a superconducting logic output signal.

20 Claims, 4 Drawing Sheets

(56) References Cited

U.S. PATENT DOCUMENTS

| | | |
|---|---|---|
| 6,750,794 B1 | 6/2004 | Durand et al. |
| 6,770,916 B2 | 8/2004 | Ohshima |
| 6,960,780 B2 | 11/2005 | Blais et al. |
| 7,219,018 B2 | 5/2007 | Vitaliano et al. |
| 7,230,266 B2 | 6/2007 | Hilton et al. |
| 7,498,832 B2 | 3/2009 | Baumgardner et al. |
| 7,613,764 B1 | 11/2009 | Hilton et al. |
| 7,613,765 B1 | 11/2009 | Hilton et al. |
| 7,714,605 B2 | 5/2010 | Baumgardner et al. |
| 7,724,020 B2 | 5/2010 | Herr |
| 7,786,748 B1 | 8/2010 | Herr |
| 7,893,708 B2 | 2/2011 | Baumgardner et al. |
| 7,969,178 B2 | 6/2011 | Przybysz et al. |
| 8,022,722 B1 | 9/2011 | Pesetski et al. |
| 8,111,083 B1 | 2/2012 | Pesetski et al. |
| 8,461,862 B2 | 6/2013 | Pesetski et al. |
| 8,922,239 B2 | 12/2014 | Pesetski et al. |
| 10,320,394 B1 * | 6/2019 | Powell ............... G06N 10/00 |
| 10,374,610 B1 * | 8/2019 | Braun ............... H03K 19/195 |
| 10,892,761 B1 * | 1/2021 | Braun ............... H03K 3/38 |
| 2002/0063643 A1 | 5/2002 | Smith et al. |
| 2002/0190381 A1 | 12/2002 | Herr et al. |
| 2003/0011398 A1 | 1/2003 | Herr |
| 2003/0016069 A1 | 1/2003 | Furuta et al. |
| 2003/0040440 A1 | 2/2003 | Wire et al. |
| 2003/0115401 A1 | 6/2003 | Herr |
| 2003/0183935 A1 | 10/2003 | Herr et al. |
| 2004/0120444 A1 | 6/2004 | Herr |
| 2004/0173793 A1 | 9/2004 | Blais et al. |
| 2004/0201099 A1 | 10/2004 | Herr |
| 2004/0201400 A1 | 10/2004 | Herr |
| 2005/0001209 A1 | 1/2005 | Hilton et al. |
| 2005/0023518 A1 | 2/2005 | Herr |
| 2005/0224784 A1 | 10/2005 | Amin et al. |
| 2008/0131047 A1 | 6/2008 | Beausoleil et al. |
| 2009/0033369 A1 | 2/2009 | Baumgardner et al. |
| 2009/0206871 A1 | 8/2009 | Baumgardner et al. |
| 2009/0322374 A1 | 12/2009 | Przybysz et al. |
| 2018/0226974 A1 | 8/2018 | Harms et al. |

FOREIGN PATENT DOCUMENTS

| | | |
|---|---|---|
| JP | 2005-527902 A | 9/2005 |
| WO | 2003/090162 A2 | 10/2003 |
| WO | 2004/012139 A2 | 2/2004 |
| WO | 2009/149086 A2 | 12/2009 |
| WO | 2009/152180 A2 | 12/2009 |
| WO | 2010/028183 A2 | 3/2010 |

OTHER PUBLICATIONS

Ortlepp, et al.: Experimental Analysis of a New Generation of Compact Josephson-inductance-based RSFQ Circuits; Authors are with the Institute of Information Technology, University of Technology Ilmenau, Germany transmitted via facsimile Apr. 2, 2008. 2 pgs.

Geller, et al.: "Superconducting Qubits Coupled to Nanoelectromechanical Resonators: an Architecture for Solid-State Quantum-Information Processing"; Physical Review A (Atomic, Molecular, and Optical Physics) APS Through AIP USA, vol. 71, No. 3, Mar. 2005, pp. 32311.1-32311.17, XP002667860, ISSN: 1050-2947; abstract, [000I], [0III]—[0VII].

Lisenfeld, J. et al.: Rabi Spectroscopy of a Qubit-Fluctuator System; Physical Review B (Condensed Matter and Materials Physics) American Physical Society by AIP USA; vol. 81, No. 10, Mar. 1, 2010, pp. 100511.1-100511.4, XP002667861, ISSN: 1098-0121; entire document.

Mariantoni, M. et al.: "Two-Resonator Circuit Quantum Electrodynamics: a Superconducting Quantum Switch"; Physical Review B (Condensed Matter and Materials Physics) American Physical Society by AIP USA; vol. 78, No. 10, Sep. 1, 2008, pp. 104508-1-104508-22, XP002667862, ISSN: 1098-0121; abstract, [00II], figure 1.

EESR (Extended European Search Report) for corresponding 22174433.7, dated Nov. 16, 2022.

* cited by examiner

SUPERCONDUCTING EXCLUSIVE-OR (XOR) GATE SYSTEM

TECHNICAL FIELD

The present invention relates generally to superconducting circuits, and specifically to a superconducting XOR-gate system.

BACKGROUND

Logic gates are an integral aspect of computer processing. Traditional computer processing that implements complementary metal-oxide semiconductor (CMOS) provides for a simplified manner of implementing logic gates using binary signals. However, superconducting technology introduces additional challenges to fabricating logic gates and implementing logic operations. As an example, in wave-pipeline (WPL) superconducting technologies, such as reciprocal quantum logic (RQL), the exclusive-OR (XOR) gate is accomplished in such a way that the maximum input size is two, and each XOR gate is implemented on a different phase boundary of an associated clock signal relative to each other. As a result, XOR gates that require more than two logic inputs operate out-of-phase with respect to each other. However, XOR gates are useful in arithmetic units like multipliers, such that XOR operations that require a larger quantity of logic inputs in typical superconducting circuits increases latency.

SUMMARY

One example describes a superconducting exclusive-OR (XOR) gate system. The system includes a pulse generator configured to generate a decision pulse. The system also includes an input superconducting XOR gate that receives a first superconducting logic input signal and a second superconducting logic input signal and is configured to perform a logic XOR function based on the decision pulse on a given phase of a clock signal to provide an intermediate superconducting logic output signal. The system also includes an output superconducting XOR gate that receives the intermediate superconducting logic output signal and a third superconducting logic input signal and is configured to perform a logic XOR function based on the decision pulse on the given phase of the clock signal to provide a superconducting logic output signal.

Another example includes a method for providing a logic exclusive-OR (XOR) function in a superconducting circuit system. The method includes providing a first superconducting logic input signal and a second superconducting logic input signal to an input superconducting XOR-2 gate. The method also includes generating a decision pulse via a pulse generator in response to a given phase of a clock signal. The input superconducting XOR-2 gate can perform a logic XOR function based on the decision pulse on the given phase of the clock signal to provide an intermediate superconducting logic output signal. The method further includes providing the intermediate superconducting logic output signal and a third superconducting logic input signal to an output superconducting XOR-2 gate. The output superconducting XOR-2 gate can perform a logic XOR function based on the decision pulse on the given phase of the clock signal to provide a superconducting logic output signal.

Another example includes a superconducting exclusive-OR (XOR) gate system. The system includes a pulse generator configured to generate a decision pulse and to delay the decision pulse to generate a delayed decision pulse. The system also includes an input superconducting XOR-2 gate that receives a first superconducting logic input signal and a second superconducting logic input signal and is configured to perform a logic XOR function based on the decision pulse on a given phase of a clock signal to provide an intermediate superconducting logic output signal. The system also includes an output superconducting XOR-2 gate that receives the intermediate superconducting logic output signal and a third superconducting logic input signal and is configured to perform a logic XOR function based on the delayed decision pulse on the given phase of the clock signal to provide a superconducting logic output signal.

DETAILED DESCRIPTION

The present invention relates generally to superconducting circuits, and specifically to a superconducting exclusive-OR (XOR) gate system. As described herein, the XOR-gate system provides an XOR-function (i.e., an output of a logic-1 in response to non-equal logic inputs) for a plurality N inputs greater than two. The superconducting XOR-gate system includes multiple two-input superconducting XOR gates to form a multi-input (e.g., three-input or four-input) superconducting XOR gate that can perform a logic XOR function on a given one phase of a clock signal. The superconducting XOR-gate system can include a pulse generator that is configured to generate a decision pulse. The pulse generator can include a delay line that can delay the decision pulse to generate a delayed decision pulse. The superconducting XOR-gate system also includes an input superconducting XOR gate that receives a first superconducting logic input signal and a second superconducting logic input signal. As described herein, the term "superconducting logic signal" (e.g., superconducting logic signal, superconducting logic input signal, superconducting logic output signal, etc.) refers to a logic signal that has a first binary logic state corresponding to a superconducting pulse (e.g., a reciprocal quantum logic (RQL) pulse or a single-flux quantum (SFQ) pulse) and has a second binary logic state corresponding to an absence of a superconducting pulse. Therefore, as described hereinafter, the "first logic state" corresponds to the presence of a pulse and the "second logic state" corresponds to the absence of a pulse.

The input superconductor XOR gate is configured to perform a logic XOR function based on the decision pulse on a given phase of the clock signal to provide an intermediate superconducting logic output signal. The superconducting XOR-gate system also includes an output superconducting XOR gate that receives the intermediate superconducting logic output signal and a third superconducting logic input signal and performs a logic XOR function to generate a superconducting logic output signal based on the delayed decision pulse on the given clock phase. In the example of a three-input superconducting XOR-gate system, the third superconducting logic input signal corresponds to a third input of the three-input superconducting XOR-gate system, such that the three-input superconducting XOR-gate system performs a logic XOR function on the first, second, and third superconducting logic input signals. In the example of a four-input superconducting XOR-gate system, the third superconducting logic input signal can correspond to a second intermediate superconducting logic output signal. Therefore, in the example of the four-input XOR gate, the second intermediate superconducting logic output signal can be generated by a second input superconducting XOR gate that receives a fourth superconducting logic input signal and a fifth superconducting logic input signal as inputs and performs a logic XOR function based on the decision pulse to generate the second intermediate superconducting logic output signal.

Figure 1:
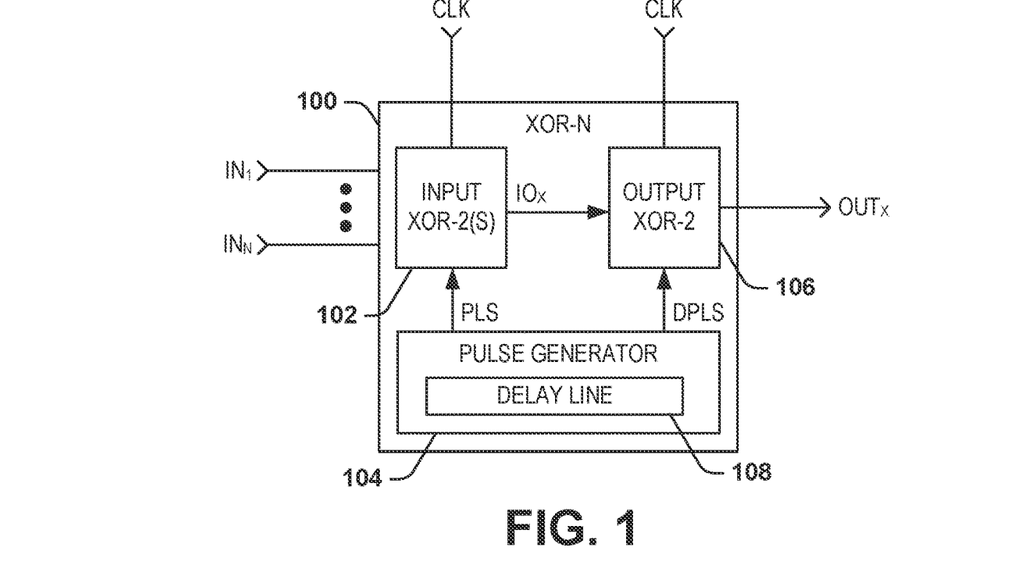
FIG. 1 illustrates an example block diagram of a superconducting exclusive-OR (XOR)-N gate system.

FIG. 1 illustrates an example block diagram of a superconducting exclusive-OR (XOR)-N gate system 100. The term "XOR-N" refers to a quantity N of superconducting logic input signals, demonstrated in the example of FIG. 1 as signals $IN_1$ through $IN_N$, where N can be a positive integer greater than two. As an example, N can be three or four, such that the superconducting XOR-gate system 100 can be a three-input superconducting XOR-gate system or a four-input superconducting XOR-gate system to perform a logic XOR function on the three or four superconducting logic input signals $IN_1$ through $IN_N$ to generate a single superconducting logic output signal $OUT_X$.

In the example of FIG. 1, the superconducting XOR-gate system 100 includes at least one input superconducting XOR gate ("INPUT XOR GATE(S)") 102 that receives the superconducting logic input signals $IN_1$ through $IN_N$. As a first example, the superconducting XOR gate(s) 102 can include only a single superconducting XOR gate 102 in the example of an XOR-3 gate, such that the superconducting XOR-gate system 100 can perform a logic XOR function on three superconducting logic input signals $IN_1$ through $IN_3$. As a second example, the superconducting XOR gate(s) 102 can include two superconducting XOR gates 102 in the example of an XOR-4 gate, such that the superconducting XOR-gate system 100 can perform a logic XOR function on four superconducting logic input signals $IN_1$ through $IN_4$. As described in greater detail herein, each of the superconducting XOR gate(s) 102 can include storage Josephson junctions at respective inputs and an escape Josephson junction to mitigate pulse propagation between the respective inputs. In the example of FIG. 1, each of the input superconducting XOR gate(s) 102 receives a clock signal CLK.

The superconducting XOR-gate system 100 also includes a pulse generator 104 that is configured to generate a decision pulse PLS that is provided to each of the input superconducting XOR gate(s) 102. Therefore, each of the input superconducting XOR gate(s) 102 performs a logic XOR function on a set of the inputs $IN_1$ through $IN_N$ based on the decision pulse PLS, as described in greater detail herein. As an example, the pulse generator 104 can include a Josephson junction having a low critical current, such that the Josephson junction can be triggered by the clock signal CLK. Therefore, the decision pulse PLS can correspond to a superconducting pulse (e.g., an RQL pulse) that is provided to the input superconducting XOR gate(s) 102 to bias a decision Josephson junction. As a result, the input superconducting XOR gate(s) 102 can perform a logic XOR function on a set of the inputs $IN_1$ through $IN_N$ based on the decision pulse PLS to generate at least one intermediate superconducting logic output signal, demonstrated in the example of FIG. 1 as a signal $IO_X$. For example, the pulse generator 104 can generate a first decision pulse PLS_1 for the first input superconducting XOR gate 102 and a second decision pulse PLS_2 for the second input superconducting XOR gate 102 for the superconducting XOR-gate system 100 being arranged as an XOR-4 gate.

The superconducting XOR-gate system 100 also includes an output superconducting XOR gate 106 that receives the intermediate superconducting logic output signal(s) $IO_X$. In the example of the superconducting XOR-gate system 100 being arranged as an XOR-3 gate, the output superconducting XOR gate 106 can also receive one of the superconducting input logic signals $IN_1$ through $IN_N$ (e.g., the superconducting input logic signal $IN_3$). Therefore, the output superconducting XOR gate 106 can perform a logic XOR function on the superconducting logic input signal $IN_3$ and the intermediate superconducting logic output signal $IO_X$. In the example of the superconducting XOR-gate system 100 being arranged as an XOR-4 gate, the output superconducting XOR gate 106 can receive a first intermediate superconducting logic output signal $IO_{X1}$ from the first input superconducting XOR gate 102 and a second intermediate superconducting logic output signal $IO_{X2}$ from the second input superconducting XOR gate 102. Therefore, the output superconducting XOR gate 106 can perform a logic XOR function on the first and second intermediate superconducting logic output signals $IO_{X1}$ and $IO_{X2}$. The output superconducting XOR gate 106 can be arranged substantially the same as the input superconducting XOR gate(s) 102. In the example of FIG. 1, the output superconducting XOR gate 106 receives the clock signal CLK.

In the example of FIG. 1, the pulse generator 104 includes a delay line 108 that is configured to generate a delayed version of the decision pulse PLS, demonstrated as a signal DPLS. The delayed decision pulse DPLS is provided to the output superconducting XOR gate 106. Therefore, similar to as described above, the delayed decision pulse DPLS can correspond to a superconducting pulse (e.g., an RQL pulse) that is provided to the output superconducting XOR gate 106 to bias a decision Josephson junction. As a result, the output superconducting XOR gate 106 can perform a logic XOR function on the intermediate superconducting logic output signal $IO_X$ and another signal (e.g., the input signal $IN_3$ or a second intermediate superconducting logic output signal $IO_{X2}$) based on the delayed decision pulse DPLS to generate the superconducting output logic signal $OUT_X$.

As an example, the delay line 108 can include a delay buffer that is formed by at least one Josephson transmission line (JTL) through which the decision pulse PLS propagates to generate the delayed decision pulse DPLS. Therefore, the propagation of the decision pulse PLS through the delay line 108 can result in the delayed decision pulse DPLS arriving at the output superconducting XOR gate 106 slightly later in time than the decision pulse PLS arrives at the input superconducting XOR gate(s) 102. Therefore, the input superconducting XOR gate(s) 102 can perform the respective logic XOR function at a time prior to the arrival of the delayed decision pulse DPLS to the output superconducting XOR gate 106.

As a result, the superconducting logic inputs to the output superconducting XOR gate 106 can arrive prior to the delayed decision pulse DPLS, thereby facilitating the logic XOR function by the output superconducting XOR gate 106 in a manner that mitigates timing errors (e.g., race conditions) associated with the logic XOR function of the output superconducting XOR gate 106. Furthermore, because the delayed decision pulse DPLS is only very slightly delayed relative to the decision pulse PLS (e.g., by propagation of the delay pulse PLS through at least one JTL), the input superconducting XOR gate(s) 102 and the output superconducting XOR gate 106 can perform the respective logic XOR functions on the same phase of the clock signal CLK. Therefore, unlike typical superconducting XOR gates having greater than two inputs, the superconducting XOR-gate system 100 can perform the logic XOR-N function on a single clock phase, as opposed to over multiple phases of the clock signal (e.g., the output being out-of-phase of the inputs by 90° or more). Accordingly, the superconducting XOR-gate system 100 can perform logic XOR functions at a lower latency than typical superconducting XOR-N gates.

Figure 2:
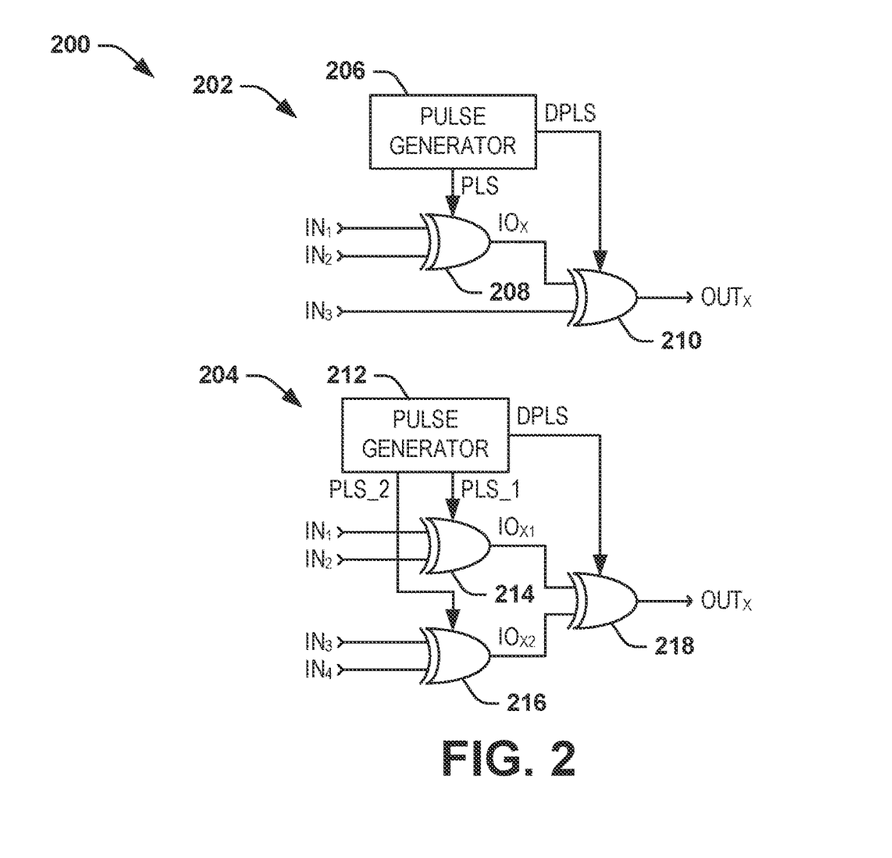
FIG. 2 illustrates an example diagram of XOR gate systems.

FIG. 2 illustrates an example diagram 200 of XOR gate systems. The diagram 200 includes a first superconducting XOR-gate system 202 and a second superconducting XOR-gate system 204. The first superconducting XOR-gate system 202 is demonstrated as an XOR-3 logic gate system that performs a logic XOR function on a set of three inputs, demonstrated as $IN_1$ through $IN_3$. The second superconducting XOR-gate system 204 is demonstrated as an XOR-4 logic gate system that performs a logic XOR function on a set of four inputs, demonstrated as $IN_1$ through $IN_4$. Each of the superconducting XOR-gate systems 202 and 204 can correspond to the superconducting XOR-gate system 100 in the example of FIG. 1. Therefore, reference is to be made to the example of FIG. 1 in the following description of the example of FIG. 2. In the example of FIG. 2, the logic XOR gates are demonstrated in the traditional notation for logic XOR gates. However, the logic XOR gates of the example of FIG. 2 correspond to superconducting XOR gates that operate on the clock signal CLK (e.g., an RQL clock signal), as described in greater detail herein.

The first superconducting XOR-gate system 202 includes a pulse generator 206, an input XOR gate 208, and an output XOR gate 210. The pulse generator 206 is demonstrated as generating a decision pulse PLS that is provided to the input XOR gate 208 and a delayed decision pulse DPLS that is provided to the output XOR gate 210. The input XOR gate 208 receives a first superconducting logic input signal $IN_1$ and a second superconducting logic input signal $IN_2$, such that the input XOR gate 208 performs a logic XOR function on the first and second superconducting logic input signals $IN_1$ and $IN_2$ based on the decision pulse PLS to generate an intermediate superconducting logic output signal $IO_X$. The output XOR gate 208 receives the intermediate superconducting logic output signal $IO_X$ and a third superconducting logic input signal $IN_3$, such that the output XOR gate 210 performs a logic XOR function on the third superconducting logic input signal $IN_3$ and the intermediate superconducting logic output signal $IO_X$ based on the delayed decision pulse DPLS to generate a superconducting logic output signal $OUT_X$.

As described previously, the delayed decision pulse DPLS can be provided to the output XOR gate 210 subsequent to the decision pulse PLS being provided to the input XOR gate 208. As a result, the input XOR gate 208 can perform the logic XOR function prior to the output XOR gate 210, such that the logic state of the intermediate superconducting logic output signal $IO_X$ can be set prior to the logic XOR function performed by the output XOR gate 210. Accordingly, the superconducting XOR-gate system 202 can perform a logic XOR-3 function on a single phase of the clock signal CLK.

The second superconducting XOR-gate system 204 includes a pulse generator 212, a first input XOR gate 214, a second input XOR gate 216, and an output XOR gate 218. The pulse generator 212 is demonstrated as generating a first decision pulse PLS_1 that is provided to the first input XOR gate 214, a second decision pulse PLS_2 that is provided to the second input XOR gate 216, and a delayed decision pulse DPLS that is provided to the output XOR gate 218. The first input XOR gate 214 receives a first superconducting logic input signal $IN_1$ and a second superconducting logic input signal $IN_2$, such that the first input XOR gate 214 performs a logic XOR function on the first and second superconducting logic input signals $IN_1$ and $IN_2$ based on the first decision pulse PLS_1 to generate a first intermediate superconducting logic output signal $IO_{X1}$. The second input XOR gate 216 receives a third superconducting logic input signal $IN_3$ and a fourth superconducting logic input signal $IN_4$, such that the second input XOR gate 216 performs a logic XOR function on the third and fourth superconducting logic input signals $IN_3$ and $IN_4$ based on the second decision pulse PLS_2 to generate a second intermediate superconducting logic output signal $IO_{X1}$. The output XOR gate 218 receives the first and second intermediate superconducting logic output signals $IO_{X1}$ and $IO_{X2}$, such that the output XOR gate 210 performs a logic XOR function on first and second intermediate superconducting logic output signals $IO_{X1}$ and $IO_{X2}$ based on the delayed decision pulse DPLS to generate a superconducting logic output signal $OUT_X$.

As described previously, the delayed decision pulse DPLS can be provided to the output XOR gate 218 subsequent to the first and second decision pulses PLS_1 and PLS_2 being provided to the respective first and second input XOR gates 214 and 216. As a result, the first and second input XOR gates 214 and 216 can perform the respective logic XOR functions prior to the output XOR gate 218, such that the logic state of the respective first and second intermediate superconducting logic output signals $IO_{X1}$ and $IO_{X2}$ can be set prior to the logic XOR function performed by the output XOR gate 218. Accordingly, the superconducting XOR-gate system 204 can perform a logic XOR-4 function on a single phase of the clock signal CLK.

Figure 3:
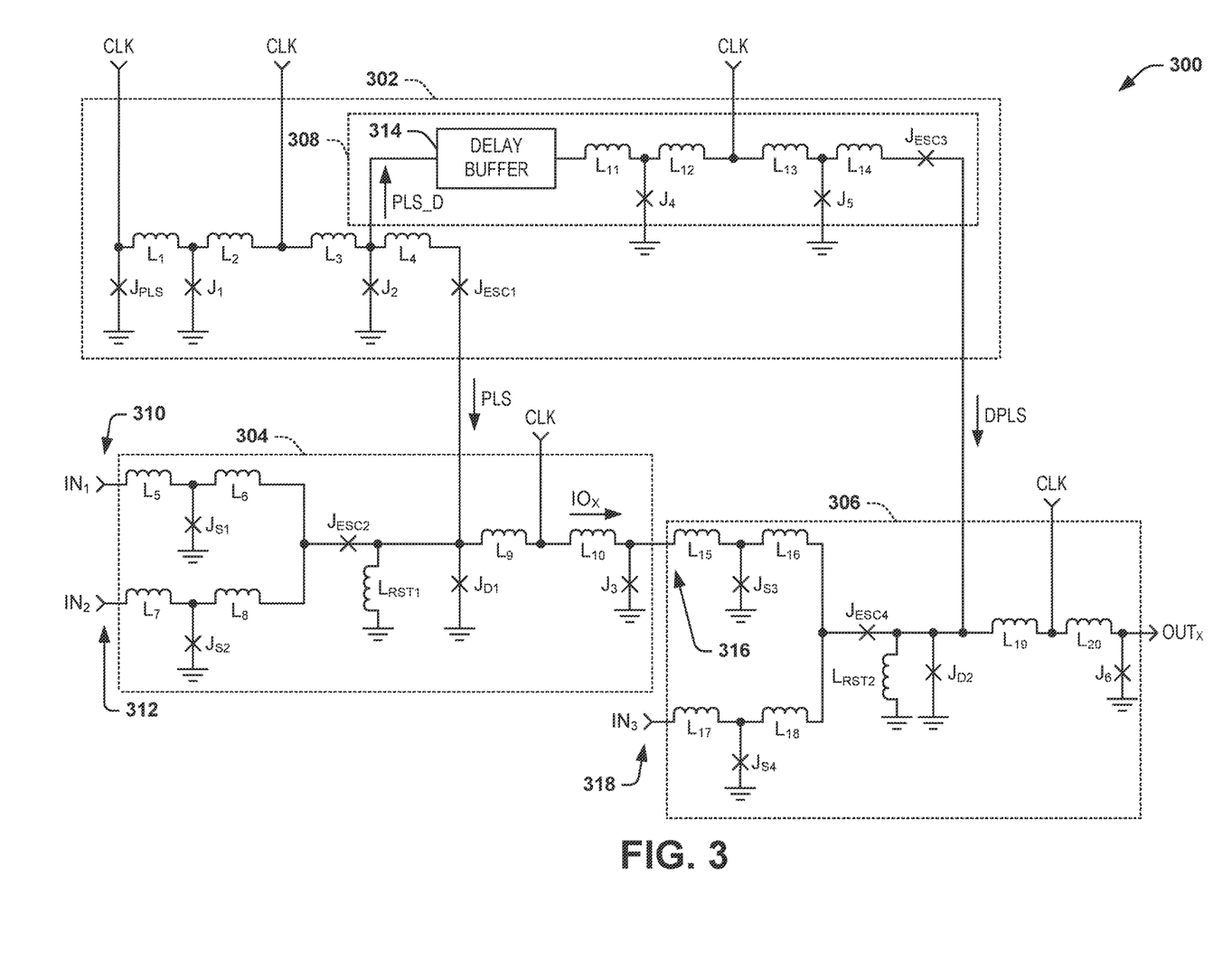
FIG. 3 illustrates an example of a superconducting XOR-3 gate circuit.

FIG. 3 illustrates an example of a superconducting XOR-3 gate circuit 300. The superconducting XOR-3 gate circuit 300 can correspond to the superconducting XOR-gate system 100 or the superconducting XOR-gate system 202 in the respective examples of FIGS. 1 and 2. Therefore, reference is to be made to the examples of FIGS. 1 and 2 in the following description of the example of FIG. 3.

The superconducting XOR-3 gate circuit 300 includes a pulse generator 302, an input superconducting XOR gate 304, and an output superconducting XOR gate 306. The pulse generator 306 includes a Josephson junction $J_{PLS}$ that is coupled to the clock signal CLK and that is fabricated to have a critical current that is relatively lower than other Josephson junctions that are biased by the clock signal CLK. Therefore, in response to a given phase of the clock signal CLK (e.g., a bias provided by the clock signal CLK), the Josephson junction $J_{PLS}$ triggers to generate the decision pulse PLS. The decision pulse PLS propagates through a JTL stage formed by an inductor $L_1$, a Josephson junction $J_1$, and an inductor $L_2$, and through another JTL stage formed by an inductor $L_3$, a Josephson junction $J_2$, and an inductor $L_4$. The JTL stages are biased by the clock signal CLK. In response to the Josephson junction $J_2$ triggering, the decision pulse PLS is split, such that a first decision pulse PLS is provided through the inductor $L_4$ to an escape Josephson junction $J_{ESC1}$ and a second decision pulse PLS_D is provided to a delay line 308.

The input superconducting XOR gate 304 receives a first superconducting logic input signal $IN_1$ at a first input 310 and a second superconducting logic input signal $IN_2$ at a second input 312. The first input 310 includes a JTL stage formed by an inductor $L_5$, a storage Josephson junction $J_{S1}$, and an inductor $L_6$. Similarly, the second input 312 includes a JTL stage formed by an inductor $L_7$, a storage Josephson junction $J_{S2}$, and an inductor $L_8$. The storage Josephson junctions $J_{S1}$ and $J_{S2}$ are unbiased. Therefore, the storage Josephson junctions $J_{S1}$ and $J_{S2}$ are each configured to trigger in response to the first logic state (e.g., a pulse) of the respective one of the superconducting logic input signals $IN_1$ and $IN_2$, but to not trigger in response to the first logic state of the other of the superconducting logic input signals $IN_1$ and $IN_2$.

The superconducting logic input signals $IN_1$ and $IN_2$ are provided to an escape Josephson junction $J_{ESC2}$ that is coupled to a grounded inductor $L_{RST1}$ and a decision Josephson junction $J_{D1}$. In response to a single one of the superconducting logic input signals $IN_1$ and $IN_2$ having the first logic state, the respective pulse introduces a flux-quantum into a decision loop formed by the decision Josephson junction $J_{D1}$ and the respective one of the storage Josephson junctions $J_{S1}$ and $J_{S2}$. The flux quantum can be insufficient to trigger the escape Josephson junction $J_{ESC2}$, but can be sufficient to trigger the decision Josephson junction $J_{D1}$ in combination with the decision pulse PLS. As a result, the intermediate superconducting logic output signal IOX can propagate as a pulse (e.g., the first logic state) from the decision Josephson junction $J_{D1}$ through an inductor $L_9$ and an inductor $L_{10}$ to trigger a Josephson junction $J_3$ via a bias from the respective phase of the clock signal CLK. The grounded inductor $L_{RST1}$, having a significantly higher inductance than the remaining inductors in the JTL stages in the input superconducting XOR gate 304, can thus operate to reset the flux quantum in the decision loop.

In response to both of the superconducting logic input signals $IN_1$ and $IN_2$ having the first logic state, the critical current of the escape Josephson junction $J_{ESC2}$ is exceeded, causing the escape Josephson junction $J_{ESC2}$ to trigger. As a result, the escape Josephson junction $J_{ESC2}$ annihilates the flux quantum in the decision loop. Alternatively, in response to both of the superconducting logic input signals $IN_1$ and $IN_2$ having the second logic state (e.g., no pulse), no flux quantum is introduced into the decision loop. In either of the same logic state examples, the decision pulse PLS triggers the escape Josephson junction $J_{ESC1}$ in the pulse generator 302, thus annihilating the decision pulse PLS. As a result, no pulse propagates from the decision Josephson junction $J_{D1}$ through the inductor $L_9$ and the inductor $L_{10}$ (and the Josephson junction $J_3$ does not trigger) based on the intermediate superconducting logic output signal IOX having the second logic state. Therefore, as described above, the input superconducting XOR gate 304 performs a logic XOR function on the first and second superconducting logic input signals $IN_1$ and $IN_2$ based on the decision pulse PLS to generate an intermediate superconducting logic output signal IOX having either the first or the second logic state.

As described above regarding the pulse generator 302, a second decision pulse PLS_D is provided to the delay line 308. The delay line 308 includes a delay buffer 314 that is configured to provide a propagation delay of the second decision pulse PLS_D. For example, the delay buffer 314 can be formed by a sequence of JTL stages. The delay line 308 also includes a JTL stage formed by an inductor $L_{11}$, a Josephson junction $J_4$, and an inductor $L_{12}$, and another JTL stage formed by an inductor $L_{13}$, a Josephson junction $J_5$, and an inductor $L_{14}$. The JTL stages can be part of the delay buffer 314, or can be separate from the JTL stages associated with the delay buffer 314. The delay line 308 can thus generate the delayed decision pulse DPLS based on the second decision pulse PLS_D. The delayed decision pulse DPLS can thus be provided to the output superconducting XOR gate 306 via an escape Josephson junction $J_{ESC3}$ in a manner that is delayed relative to the decision pulse PLS provided to the input superconducting XOR gate 304. As an example, the quantity of JTL stages of the delay buffer 314 can be sufficient to delay the arrival of the delayed decision pulse DPLS to occur sufficiently after the time that the input superconducting XOR gate 304 performs the logic XOR function and provides the resultant intermediate superconducting logic output signal IOX.

The output superconducting XOR gate 308 receives the intermediate superconducting logic output signal $IO_X$ at a first input 316 and a third superconducting logic input signal $IN_3$ at a second input 318. The first input 316 includes a JTL stage formed by an inductor $L_{15}$, a storage Josephson junction $J_{S3}$, and an inductor $L_{16}$. Similarly, the second input 318 includes a JTL stage formed by an inductor $L_{17}$, a storage Josephson junction $J_{S4}$, and an inductor $L_{18}$. The storage Josephson junctions $J_{S3}$ and $J_{S4}$ are unbiased, and therefore are fabricated to have a relatively low critical current (e.g., relative to the JTL stages associated with the pulse generator 306 and/or the superconducting XOR gates 304 and 306). Therefore, the storage Josephson junctions $J_{S3}$ and $J_{S4}$ are each configured to trigger in response to the first logic state (e.g., a pulse) of the respective one of the intermediate superconducting logic output signal $IO_X$ and the superconducting logic input signal $IN_3$, but to not trigger in response to the first logic state of the other of the intermediate superconducting logic output signal $IO_X$ and the superconducting logic input signal $IN_3$.

The intermediate superconducting logic output signal $IO_X$ and the superconducting logic input signal $IN_3$ are provided to an escape Josephson junction $J_{ESC4}$ that is coupled to a grounded inductor $L_{RST2}$ and a decision Josephson junction $J_{D2}$. In response to a single one of the intermediate superconducting logic output signal $IO_X$ and the superconducting logic input signal $IN_3$ having the first logic state, the respective pulse introduces a flux-quantum into a decision loop formed by the decision Josephson junction $J_{D2}$ and the respective one of the storage Josephson junctions $J_{S3}$ and $J_{S4}$. The flux quantum can be insufficient to trigger the escape Josephson junction $J_{ESC4}$, but can be sufficient to trigger the decision Josephson junction $J_{D2}$ in combination with the delayed decision pulse DPLS. As a result, the superconducting logic output signal $OUT_X$ can propagate as a pulse (e.g., the first logic state) from the decision Josephson junction $J_{D2}$ through an inductor $L_{19}$ and an inductor $L_{20}$ to trigger a Josephson junction $J_6$ via a bias from the respective phase of the clock signal CLK. The grounded inductor $L_{RST2}$, having a significantly higher inductance than the remaining inductors in the JTL stages in the output superconducting XOR gate 308, can thus operate to reset the flux quantum in the decision loop.

In response to both of the intermediate superconducting logic output signal $IO_X$ and the superconducting logic input signal $IN_3$ having the first logic state, the critical current of the escape Josephson junction $J_{ESC4}$ is exceeded, causing the escape Josephson junction $J_{ESC4}$ to trigger. As a result, the escape Josephson junction $J_{ESC4}$ annihilates the flux quantum in the decision loop. Alternatively, in response to both of the intermediate superconducting logic output signal $IO_X$ and the superconducting logic input signal $IN_3$ having the second logic state (e.g., no pulse), no flux quantum is introduced into the decision loop. In either of the same logic state examples, the delayed decision pulse DPLS triggers the escape Josephson junction $J_{ESC3}$ in the delay line 308, thus annihilating the delayed decision pulse DPLS. As a result, no pulse propagates from the decision Josephson junction $J_{D2}$ through the inductor $L_{19}$ and the inductor $L_{20}$ (and the Josephson junction $J_6$ does not trigger) based on the superconducting logic output signal $OUT_X$ having the second logic state. Therefore, as described above, the output superconducting XOR gate 306 performs a logic XOR function on the intermediate superconducting logic output signal $IO_X$ and the superconducting logic input signal $IN_3$ based on the delayed decision pulse DPLS to generate the superconducting logic output signal $OUT_X$ having either the first or the second logic state.

As a result, as described above, the superconducting logic inputs to the output superconducting XOR gate 306 can arrive prior to the delayed decision pulse DPLS, thereby facilitating the logic XOR function by the output superconducting XOR gate 306 in a manner that mitigates timing errors (e.g., race conditions) associated with the logic XOR function of the output superconducting XOR gate 306. Furthermore, because the delayed decision pulse DPLS is only very slightly delayed relative to the decision pulse PLS (e.g., by propagation of the second delay pulse PLS_D through the delay buffer 314), the input superconducting XOR gate 304 and the output superconducting XOR gate 306 can perform the respective logic XOR functions on the same phase of the clock signal CLK.

Figure 4:
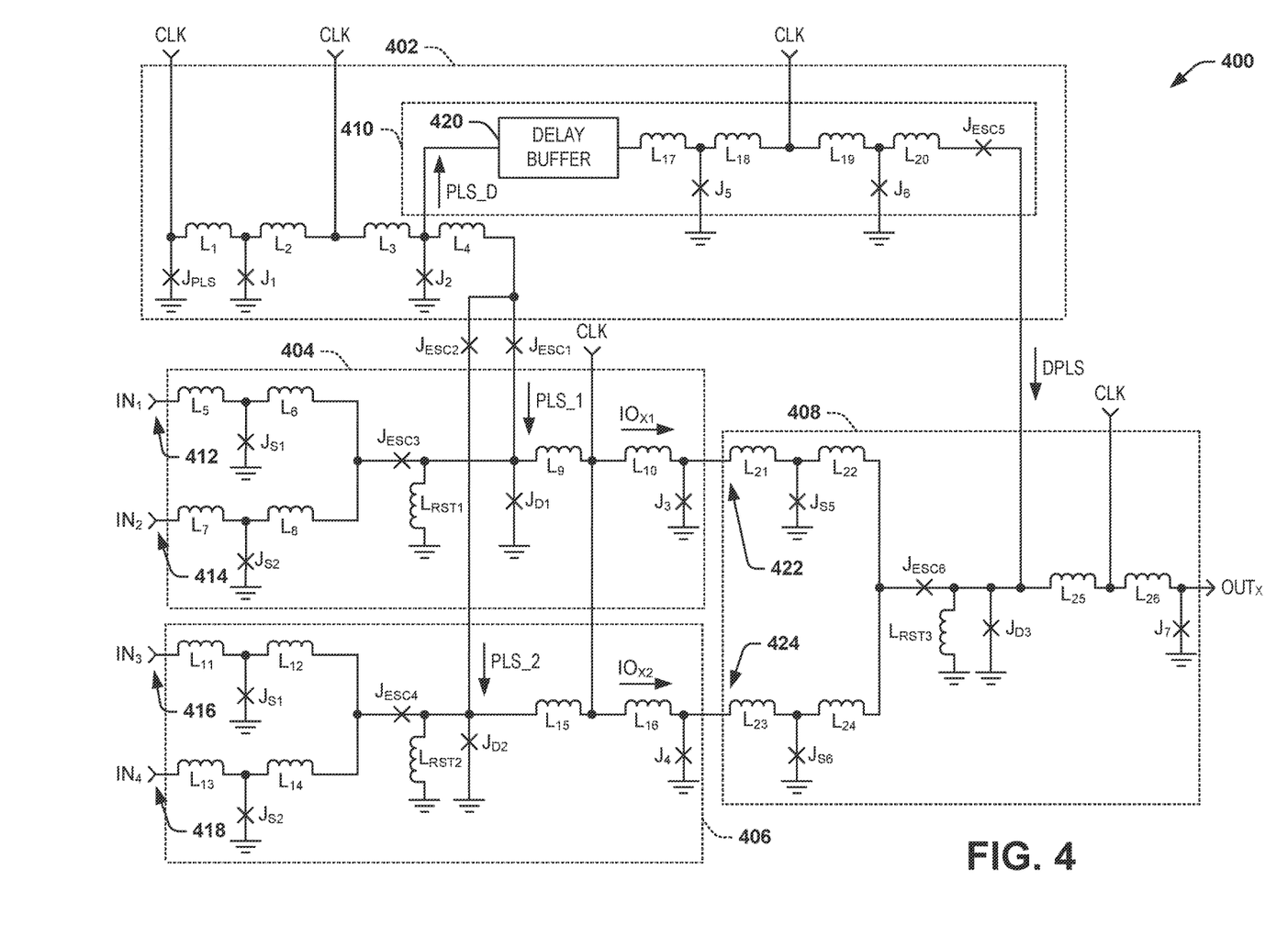
FIG. 4 illustrates an example of a superconducting XOR-4 gate circuit.

FIG. 4 illustrates an example of a superconducting XOR-4 gate circuit 400. The superconducting XOR-4 gate circuit 400 can correspond to the superconducting XOR-gate system 100 or the superconducting XOR-gate system 202 in the respective examples of FIGS. 1 and 2. Therefore, reference is to be made to the examples of FIGS. 1 and 2 in the following description of the example of FIG. 4.

The superconducting XOR-4 gate circuit 400 includes a pulse generator 402, a first input superconducting XOR gate 404, a second input superconducting XOR gate 406, and an output superconducting XOR gate 408. The pulse generator 408 includes a Josephson junction $J_{PLS}$ that is fabricated to have a relatively low critical current (e.g., relative to the JTL stages associated with the pulse generator 408 and/or the superconducting XOR gates 404 and 408). The Josephson junction $J_{PLS}$ is coupled to the clock signal CLK, such that, in response to a given phase of the clock signal (e.g., a bias provided by the clock signal CLK), the Josephson junction $J_{PLS}$ triggers to generate the decision pulse PLS. The decision pulse PLS propagates through a JTL stage formed by an inductor $L_1$, a Josephson junction $J_1$, and an inductor $L_2$, and through another JTL stage formed by an inductor $L_3$, a Josephson junction $J_2$, and an inductor $L_4$. The JTL stages are biased by the clock signal CLK. In response to the Josephson junction $J_2$ triggering, the decision pulse PLS is split, such that a first decision pulse PLS_1 is provided through an escape Josephson junction $J_{ESC1}$ to the first superconducting XOR gate 304, a second decision pulse PLS_2 is provided through an escape Josephson junction $J_{ESC2}$ to the second superconducting XOR gate 306, and a third decision pulse PLS_D is provided to a delay line 410.

The first input superconducting XOR gate 404 receives a first superconducting logic input signal $IN_1$ at a first input 412 and a second superconducting logic input signal $IN_2$ at a second input 414. The first input 412 includes a JTL stage formed by an inductor $L_5$, a storage Josephson junction $J_{S1}$, and an inductor $L_6$. Similarly, the second input 414 includes a JTL stage formed by an inductor $L_7$, a storage Josephson junction $J_{S2}$, and an inductor $L_8$. The storage Josephson junctions $J_{S1}$ and $J_{S2}$ are unbiased, and therefore are fabricated to have a relatively low critical current (e.g., relative to the JTL stages associated with the pulse generator 408 and/or the superconducting XOR gates 404 and 408). Therefore, the storage Josephson junctions $J_{S1}$ and $J_{S2}$ are each configured to trigger in response to the first logic state (e.g., a pulse) of the respective one of the superconducting logic input signals $IN_1$ and $IN_2$, but to not trigger in response to the first logic state of the other of the superconducting logic input signals $IN_1$ and $IN_2$.

The superconducting logic input signals $IN_1$ and $IN_2$ are provided to an escape Josephson junction $J_{ESC3}$ that is coupled to a grounded inductor $L_{RST1}$ and a decision Josephson junction $J_{D1}$. In response to a single one of the superconducting logic input signals $IN_1$ and $IN_2$ having the first logic state, the respective pulse introduces a flux-quantum into a decision loop formed by the decision Josephson junction $J_{D1}$ and the respective one of the storage Josephson junctions $J_{S1}$ and $J_{S2}$. The flux quantum can be insufficient to trigger the escape Josephson junction $J_{ESC2}$, but can be sufficient to trigger the decision Josephson junction $J_{D1}$ in combination with the first decision pulse PLS_1. As a result, a first intermediate superconducting logic output signal $IO_{X1}$ can propagate as a pulse (e.g., the first logic state) from the decision Josephson junction $J_{D1}$ through an inductor $L_9$ and an inductor $L_{10}$ to trigger a Josephson junction $J_3$ via a bias from the respective phase of the clock signal CLK. The grounded inductor $L_{RST1}$, having a significantly higher inductance than the remaining inductors in the JTL stages in the first input superconducting XOR gate 404, can thus operate to reset the flux quantum in the decision loop.

In response to both of the superconducting logic input signals $IN_1$ and $IN_2$ having the first logic state, the critical current of the escape Josephson junction $J_{ESC3}$ is exceeded, causing the escape Josephson junction $J_{ESC3}$ to trigger. As a result, the escape Josephson junction $J_{ESC3}$ annihilates the flux quantum in the decision loop. Alternatively, in response to both of the superconducting logic input signals $IN_1$ and $IN_2$ having the second logic state (e.g., no pulse), no flux quantum is introduced into the decision loop. In either of the same logic state examples, the first decision pulse PLS_1 triggers the escape Josephson junction $J_{ESC1}$ in the pulse generator 402, thus annihilating the first decision pulse PLS_1. As a result, no pulse propagates from the decision Josephson junction $J_{D1}$ through the inductor $L_9$ and the inductor $L_{10}$ (and the Josephson junction $J_3$ does not trigger) based on the first intermediate superconducting logic output signal $IO_{X1}$ having the second logic state. Therefore, as described above, the first input superconducting XOR gate 404 performs a logic XOR function on the first and second superconducting logic input signals $IN_1$ and $IN_2$ based on the first decision pulse PLS_1 to generate a first intermediate superconducting logic output signal $IO_{X1}$ having either the first or the second logic state.

The second input superconducting XOR gate 406 receives a third superconducting logic input signal $IN_3$ at a first input 416 and a second superconducting logic input signal $IN_2$ at a second input 418. The first input 416 includes a JTL stage formed by an inductor $L_{11}$, a storage Josephson junction $J_{S3}$, and an inductor $L_{12}$. Similarly, the second input 418 includes a JTL stage formed by an inductor $L_{13}$, a storage Josephson junction $J_{S4}$, and an inductor $L_{14}$. The storage Josephson junctions $J_{S3}$ and $J_{S4}$ are unbiased, and therefore are fabricated to have a relatively low critical current (e.g., relative to the JTL stages associated with the pulse generator 402 and/or the superconducting XOR gates 404, 406, and 408). Therefore, the storage Josephson junctions $J_{S3}$ and $J_{S4}$ are each configured to trigger in response to the first logic state (e.g., a pulse) of the respective one of the superconducting logic input signals $IN_3$ and $IN_4$, but to not trigger in response to the first logic state of the other of the superconducting logic input signals $IN_3$ and $IN_4$.

The superconducting logic input signals $IN_3$ and $IN_4$ are provided to an escape Josephson junction $J_{ESC4}$ that is coupled to a grounded inductor $L_{RST2}$ and a decision Josephson junction $J_{D2}$. In response to a single one of the superconducting logic input signals $IN_3$ and $IN_4$ having the first logic state, the respective pulse introduces a flux-quantum into a decision loop formed by the decision Josephson junction $J_{D2}$ and the respective one of the storage Josephson junctions $J_{S3}$ and $J_{S4}$. The flux quantum can be insufficient to trigger the escape Josephson junction $J_{ESC3}$, but can be sufficient to trigger the decision Josephson junction $J_{D2}$ in combination with the second decision pulse PLS_2. As a result, a second intermediate superconducting logic output signal $IO_{X2}$ can propagate as a pulse (e.g., the first logic state) from the decision Josephson junction $J_{D2}$ through an inductor Lis and an inductor $L_{16}$ to trigger a Josephson junction $J_4$ via a bias from the respective phase of the clock signal CLK. The grounded inductor $L_{RST2}$, having a significantly higher inductance than the remaining inductors in the JTL stages in the second input superconducting XOR gate 406, can thus operate to reset the flux quantum in the decision loop.

In response to both of the superconducting logic input signals $IN_3$ and $IN_4$ having the first logic state, the critical current of the escape Josephson junction $J_{ESC4}$ is exceeded, causing the escape Josephson junction $J_{ESC4}$ to trigger. As a result, the escape Josephson junction $J_{ESC4}$ annihilates the flux quantum in the decision loop. Alternatively, in response to both of the superconducting logic input signals $IN_3$ and $IN_4$ having the second logic state (e.g., no pulse), no flux quantum is introduced into the decision loop. In either of the same logic state examples, the second decision pulse PLS_2 triggers the escape Josephson junction $J_{ESC2}$ in the pulse generator 402, thus annihilating the second decision pulse PLS_2. As a result, no pulse propagates from the decision Josephson junction $J_{D2}$ through the inductor $L_{15}$ and the inductor $L_{16}$ (and the Josephson junction $J_4$ does not trigger) based on the second intermediate superconducting logic output signal $IO_{X2}$ having the second logic state. Therefore, as described above, the second input superconducting XOR gate 406 performs a logic XOR function on the third and fourth superconducting logic input signals $IN_3$ and $IN_4$ based on the second decision pulse PLS_2 to generate a second intermediate superconducting logic output signal $IO_{X2}$ having either the first or the second logic state.

As described above regarding the pulse generator 402, a third decision pulse PLS_D is provided to the delay line 410. The delay line 410 includes a delay buffer 420 that is configured to provide a propagation delay of the third decision pulse PLS_D. For example, the delay buffer 420 can be formed by a sequence of JTL stages. The delay line 410 also includes a JTL stage formed by an inductor $L_{17}$, a Josephson junction $J_5$, and an inductor $L_{18}$, and another JTL stage formed by an inductor $L_{19}$, a Josephson junction $J_6$, and an inductor $L_{20}$. The JTL stages can be part of the delay buffer 420, or can be separate from the JTL stages associated with the delay buffer 420. The delay line 410 can thus generate the delayed decision pulse DPLS based on the third decision pulse PLS_D. The delayed decision pulse DPLS can thus be provided to the output superconducting XOR gate 408 via an escape Josephson junction $J_{ESC5}$ in a manner that is delayed relative to the first and second decision pulses PLS_1 and PLS_2 provided to the respective first and second input superconducting XOR gates 404 and 406. As an example, the quantity of JTL stages of the delay buffer 420 can be sufficient to delay the arrival of the delayed decision pulse DPLS to occur sufficiently after the time that the first and second input superconducting XOR gates 404 and 406 perform the logic XOR functions and provides the resultant first and second intermediate superconducting logic output signals $IO_{X1}$ and $IO_{X2}$.

The output superconducting XOR gate 410 receives the first intermediate superconducting logic output signal $IO_{X1}$ at a first input 422 and the second intermediate superconducting logic output signal $IO_{X2}$ at a second input 424. The first input 422 includes a JTL stage formed by an inductor $L_{21}$, a storage Josephson junction $J_{S5}$, and an inductor $L_{22}$. Similarly, the second input 424 includes a JTL stage formed by an inductor $L_{23}$, a storage Josephson junction $J_{S6}$, and an inductor $L_{24}$. The storage Josephson junctions $J_{S5}$ and $J_{S6}$ are unbiased, and therefore are fabricated to have a relatively low critical current (e.g., relative to the JTL stages associated with the pulse generator 408 and/or the superconducting XOR gates 404, 406, and 408). Therefore, the storage Josephson junctions $J_{S5}$ and $J_{S6}$ are each configured to trigger in response to the first logic state (e.g., a pulse) of the respective one of the first and second intermediate superconducting logic output signals $IO_{X1}$ and $IO_{X2}$, but to not trigger in response to the first logic state of the other of the first and second intermediate superconducting logic output signals $IO_{X1}$ and $IO_{X2}$.

The first intermediate superconducting logic output signal $IO_{X1}$ and the second intermediate superconducting logic output signal $IO_{X2}$ are provided to an escape Josephson junction $J_{ESC6}$ that is coupled to a grounded inductor $L_{RST3}$ and a decision Josephson junction $J_{D3}$ In response to a single one of the first and second intermediate superconducting logic output signals $IO_{X1}$ and $IO_{X2}$ having the first logic state, the respective pulse introduces a flux-quantum into a decision loop formed by the decision Josephson junction $J_{D3}$ and the respective one of the storage Josephson junctions $J_{S5}$ and $J_{S6}$. The flux quantum can be insufficient to trigger the escape Josephson junction $J_{ESC6}$, but can be sufficient to trigger the decision Josephson junction $J_{D3}$ in combination with the delayed decision pulse DPLS. As a result, the superconducting logic output signal $OUT_X$ can propagate as a pulse (e.g., the first logic state) from the decision Josephson junction $J_{D3}$ through an inductor $L_{25}$ and an inductor $L_{26}$ to trigger a Josephson junction $J_7$ via a bias from the respective phase of the clock signal CLK. The grounded inductor $L_{RST3}$, having a significantly higher inductance than the remaining inductors in the JTL stages in the output superconducting XOR gate 410, can thus operate to reset the flux quantum in the decision loop.

In response to both of the first and second intermediate superconducting logic output signals $IO_{X1}$ and $IO_{X2}$ having the first logic state, the critical current of the escape Josephson junction $J_{ESC6}$ is exceeded, causing the escape Josephson junction $J_{ESC6}$ to trigger. As a result, the escape Josephson junction $J_{ESC6}$ annihilates the flux quantum in the decision loop. Alternatively, in response to both of the first and second intermediate superconducting logic output signals $IO_{X1}$ and $IO_{X2}$ having the second logic state (e.g., no pulse), no flux quantum is introduced into the decision loop. In either of the same logic state examples, the delayed decision pulse DPLS triggers the escape Josephson junction $J_{ESC5}$ in the delay line 410, thus annihilating the delayed decision pulse DPLS. As a result, no pulse propagates from the decision Josephson junction $J_{D3}$ through the inductor $L_{25}$ and the inductor $L_{26}$ (and the Josephson junction $J_7$ does not trigger) based on the superconducting logic output signal $OUT_X$ having the second logic state. Therefore, as described above, the output superconducting XOR gate 408 performs a logic XOR function on the first and second intermediate superconducting logic output signals $IO_{X1}$ and $IO_{X2}$ based on the delayed decision pulse DPLS to generate the superconducting logic output signal $OUT_X$ having either the first or the second logic state.

As a result, as described above, the superconducting logic inputs to the output superconducting XOR gate 408 can arrive prior to the delayed decision pulse DPLS, thereby facilitating the logic XOR function by the output superconducting XOR gate 408 in a manner that mitigates timing errors (e.g., race conditions) associated with the logic XOR function of the output superconducting XOR gate 408. Furthermore, because the delayed decision pulse DPLS is only very slightly delayed relative to the first and second decision pulses PLS_1 and PLS_2 (e.g., by propagation of the second delay pulse PLS_D through the delay buffer 420), the first input superconducting XOR gate 404, the second input superconducting XOR gate 406, and the output superconducting XOR gate 408 can perform the respective logic XOR functions on the same phase of the clock signal CLK.

Figure 5:
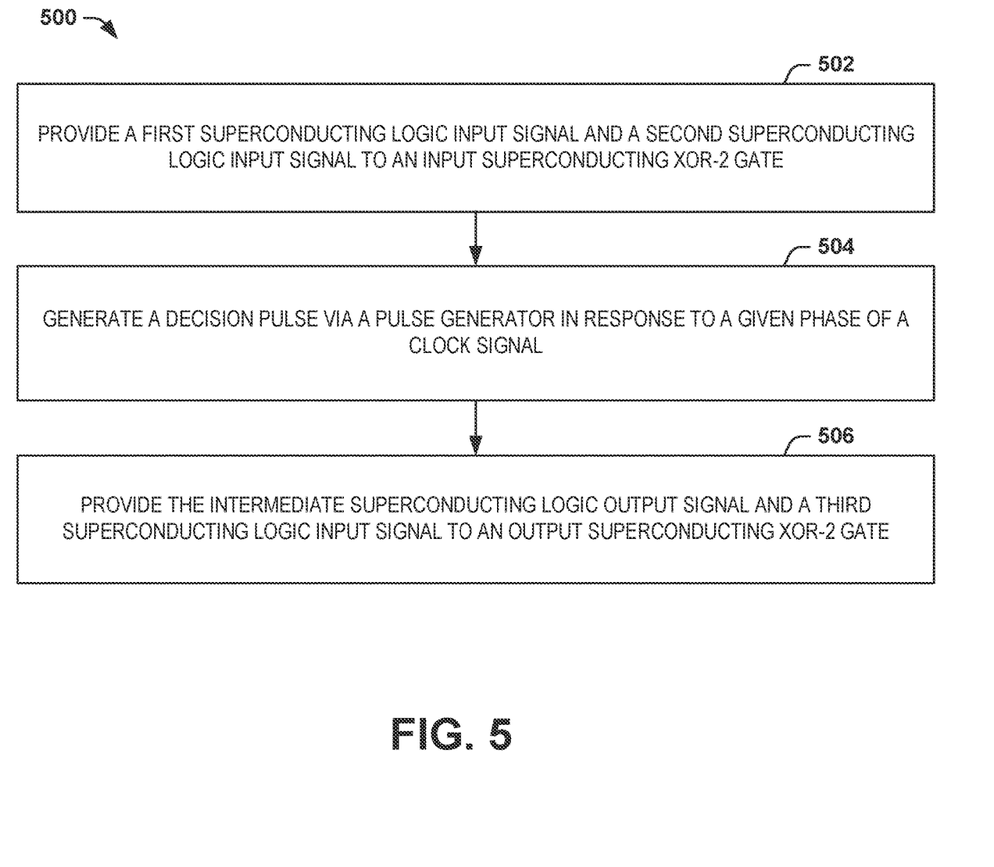
FIG. 5 illustrates an example of a method for performing a logic XOR operation.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 500 for providing a logic XOR function in a superconducting circuit system (e.g., the superconducting XOR-gate system 100). At 502, a first superconducting logic input signal (e.g., the first superconducting logic input signal $IN_1$) and a second superconducting logic input signal (e.g., the second superconducting logic input signal $IN_2$) are provided to an input superconducting XOR-2 gate (e.g., one of the input superconducting XOR gate(s) 104). At 504, a decision pulse (e.g., the decision pulse PLS) is generated via a pulse generator (e.g., the pulse generator 104) in response to a given phase of a clock signal (e.g., the clock signal CLK). The input superconducting XOR-2 gate can perform a logic XOR function based on the decision pulse on the given phase of the clock signal to provide an intermediate superconducting logic output signal (e.g., the intermediate superconducting logic output signal $IO_X$). At 506, the intermediate superconducting logic output signal and a third superconducting logic input signal (e.g., the third superconducting logic input signal $IN_3$ or the second intermediate superconducting logic output signal $IO_{X2}$) are provided to an output superconducting XOR-2 gate (e.g., the superconducting output XOR gate 106). The output superconducting XOR-2 gate can perform a logic XOR function based on the decision pulse on the given phase of the clock signal to provide a superconducting logic output signal (e.g., the superconducting logic output signal $OUT_X$).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting XOR-gate system comprising:
a pulse generator configured to generate a decision pulse;
an input superconducting XOR gate that receives a first superconducting logic input signal and a second superconducting logic input signal and is configured to perform a logic XOR function based on the decision pulse on a given phase of a clock signal to provide an intermediate superconducting logic output signal; and
an output superconducting XOR gate that receives the intermediate superconducting logic output signal and a third superconducting logic input signal and is configured to perform a logic XOR function based on the decision pulse on the given phase of the clock signal to provide a superconducting logic output signal.

2. The system of claim 1, wherein the pulse generator comprises a delay line to generate a delayed decision pulse, wherein the output superconducting XOR gate is configured to perform the logic XOR function based on the delayed decision pulse on the given phase of the clock signal.

3. The system of claim 2, wherein the delay line comprises a delay buffer, the delay buffer comprising at least one Josephson transmission line.

4. The system of claim 1, wherein the first XOR gate comprises a first input stage that receives the first superconducting logic input signal and a second input stage that receives the second superconducting logic input signal, wherein the second XOR gate comprises a third input stage that receives the third superconducting logic input signal and a fourth input stage that receives the intermediate superconducting logic output signal, wherein each of the first, second, third, and fourth input stages comprises a storage Josephson junction that is not biased by the clock signal.

5. The system of claim 1, wherein the input superconducting XOR gate comprises a first escape Josephson junction and the output superconducting XOR gate comprises a second escape Josephson junction, wherein the first escape Josephson junction is configured to trigger in response to both the first and second superconducting logic input signals being provided as pulse signals to result in the intermediate superconducting logic output signal being provided as a non-pulse signal, wherein the second Josephson junction is configured to trigger in response to both the third superconducting logic input signal and the intermediate superconducting logic output signal being provided as pulse signals to result in the superconducting logic output signal being provided as a non-pulse signal.

6. The system of claim 1, wherein the first, second, and third superconducting logic input signals are provided as Reciprocal Quantum Logic (RQL) pulse, such that the XOR gate system is configured to provide the superconducting logic output signal as an RQL pulse.

7. The system of claim 6, wherein the input superconducting XOR gate comprises a first grounded inductor coupled to a first decision Josephson junction that is biased by the decision pulse and the output superconducting XOR gate comprises a second grounded inductor coupled to a second decision Josephson junction that is biased by the decision pulse, wherein the first and second grounded inductors have an inductance value that is greater than Josephson transmission lines (JTLs) associated with the first and output superconducting XOR gates to facilitate reset of the respective first and second decision Josephson junctions.

8. The system of claim 1, wherein the input superconducting XOR gate is configured as a first input superconducting XOR gate to perform the logic XOR function to provide a first intermediate superconducting logic output signal, wherein the output superconducting XOR gate receives the first intermediate superconducting logic output signal and the third superconducting logic input signal corresponding to a second intermediate superconducting logic output signal to perform the logic XOR function to provide the superconducting logic output signal, the system further comprising a second input superconducting XOR gate that receives a fourth superconducting logic input signal and a fifth superconducting logic input signal and is configured to perform a logic XOR function based on the decision pulse on the given phase of the clock signal to provide the second intermediate superconducting logic output signal.

9. The system of claim 1, wherein the pulse generator comprises a first Josephson junction to which the clock signal is provided and at least one Josephson transmission line each comprising at least one second Josephson junction to which the clock signal is provided, wherein the first Josephson junction has a critical current that is less than the at least one second Josephson junction.

10. The system of claim 1, wherein each of the input superconducting XOR gate and the output superconducting XOR gate are arranged as XOR-2 gates.

11. A method for providing a logic XOR function in a superconducting circuit system, the method comprising:
providing a first superconducting logic input signal and a second superconducting logic input signal to an input superconducting XOR-2 gate; and
generating a decision pulse via a pulse generator in response to a given phase of a clock signal, the input superconducting XOR-2 gate performing a logic XOR function based on the decision pulse on the given phase of the clock signal to provide an intermediate superconducting logic output signal; and
providing the intermediate superconducting logic output signal and a third superconducting logic input signal to an output superconducting XOR-2 gate, the output superconducting XOR-2 gate performing a logic XOR function based on the decision pulse on the given phase of the clock signal to provide a superconducting logic output signal.

12. The method of claim 11, wherein generating the decision pulse comprises:
generating the decision pulse;
splitting the decision pulse into a first decision pulse and a second decision pulse;
providing the first decision pulse to the input superconducting XOR-2 gate;
delaying the second decision pulse to generate a delayed decision pulse; and
providing the delayed decision pulse to the output superconducting XOR-2 gate to perform the logic XOR function via the output superconducting XOR-2 gate based on the delayed decision pulse.

13. The method of claim 11, wherein providing the first, second, and third superconducting logic input signals comprises providing the first, second, and third superconducting logic input signals as Reciprocal Quantum Logic (RQL) pulse, such that the superconducting logic output signal is provided as an RQL pulse.

14. The method of claim 11, wherein providing the first and second superconducting logic input signals comprises providing the first and second superconducting logic input signals to a first input superconducting XOR-2 gate, wherein providing the intermediate superconducting logic output signal comprises providing a first intermediate superconducting logic output signal, the method further comprising providing a fourth superconducting logic input signal and a fifth superconducting logic input signal to a second input superconducting XOR-2 gate, the second input superconducting XOR-2 gate performing a logic XOR function based on the decision pulse on the given phase of the clock signal to provide a second intermediate superconducting logic output signal corresponding to a second intermediate superconducting logic output signal, wherein providing the intermediate superconducting logic output signal and the third superconducting logic input signal comprises providing the first and second intermediate superconducting logic output signals to the output superconducting XOR-2 gate, the output superconducting XOR-2 gate performing the logic XOR function based on the decision pulse on the given phase of the clock signal to provide the superconducting logic output signal.

15. The method of claim 14, wherein generating the decision pulse comprises:
generating the decision pulse;
splitting the decision pulse into a first decision pulse, a second decision pulse, and a third decision pulse;
providing the first decision pulse to the input superconducting XOR-2 gate;
providing the second decision pulse to the second input superconducting XOR-2 gate;
delaying the third decision pulse to generate a delayed decision pulse; and
providing the delayed decision pulse to the output superconducting XOR-2 gate to perform the logic XOR function via the output superconducting XOR-2 gate based on the delayed decision pulse.

16. A superconducting XOR-gate system comprising:
a pulse generator configured to generate a decision pulse and to delay the decision pulse to generate a delayed decision pulse;
an input superconducting XOR-2 gate that receives a first superconducting logic input signal and a second superconducting logic input signal and is configured to perform a logic XOR function based on the decision pulse on a given phase of a clock signal to provide an intermediate superconducting logic output signal; and
an output superconducting XOR-2 gate that receives the intermediate superconducting logic output signal and a third superconducting logic input signal and is configured to perform a logic XOR function based on the delayed decision pulse on the given phase of the clock signal to provide a superconducting logic output signal.

17. The system of claim 16, wherein the pulse generator comprises a delay line comprising a delay buffer, the delay buffer comprising at least one Josephson transmission line to generate the delayed decision pulse.

18. The system of claim 16, wherein the first XOR-2 gate comprises a first input stage that receives the first superconducting logic input signal and a second input stage that receives the second superconducting logic input signal, wherein the second XOR-2 gate comprises a third input stage that receives the third superconducting logic input signal and a fourth input stage that receives the intermediate superconducting logic output signal, wherein each of the first, second, third, and fourth input stages comprises a storage Josephson junction that is not biased by the clock signal.

19. The system of claim 16, wherein the first, second, and third superconducting logic input signals are provided as Reciprocal Quantum Logic (RQL) pulse, such that the XOR-2 gate system is configured to provide the superconducting logic output signal as an RQL pulse.

20. The system of claim 16, wherein the input superconducting XOR-2 gate is configured as a first input superconducting XOR-2 gate to perform the logic XOR function to provide a first intermediate superconducting logic output signal, wherein the output superconducting XOR-2 gate receives the first intermediate superconducting logic output signal and the third superconducting logic input signal corresponding to a second intermediate superconducting logic output signal to perform the logic XOR function to provide the superconducting logic output signal, the system further comprising a second input superconducting XOR-2 gate that receives a fourth superconducting logic input signal and a fifth superconducting logic input signal and is configured to perform a logic XOR function based on the decision pulse on the given phase of the clock signal to provide the second intermediate superconducting logic output signal.

* * * * *